US008633502B2

(12) United States Patent
Kawashima

(10) Patent No.: US 8,633,502 B2
(45) Date of Patent: Jan. 21, 2014

(54) LIGHTING APPARATUS ENCAPSULATED WITH SYNTHETIC RESIN MATERIAL HAVING TRANSLUCENT ILLUMINATION SECTION AND ALSO HAVING HEAT SINK SECTION MIXED WITH THERMAL CONDUCTIVE MATERIAL

(75) Inventor: Hiroaki Kawashima, Saitama (JP)

(73) Assignees: Suzuden Company, Limited, Tokyo (JP); Suzuden Hanbai Company, Limited, Tokyo (JP)

( * ) Notice: Subject to any disclaimer, the term of this patent is extended or adjusted under 35 U.S.C. 154(b) by 244 days.

(21) Appl. No.: 13/203,330

(22) PCT Filed: Dec. 14, 2010

(86) PCT No.: PCT/JP2010/072840

§ 371 (c)(1), (2), (4) Date: Aug. 25, 2011

(87) PCT Pub. No.: WO2011/074692

PCT Pub. Date: Jun. 23, 2011

(65) Prior Publication Data

US 2011/0309403 A1 Dec. 22, 2011

(30) Foreign Application Priority Data

Dec. 17, 2009 (JP) ................................ 2009-286747

(51) Int. Cl.
*H01L 33/52* (2010.01)
*H01L 33/54* (2010.01)

(52) U.S. Cl.
USPC 257/98; 257/100; 257/E33.059; 257/E33.075

(58) Field of Classification Search
CPC .................................................... H01L 33/644
USPC .................................................. 257/E33.075
See application file for complete search history.

(56) References Cited

U.S. PATENT DOCUMENTS 8,277,109 B2 * 10/2012 Ko ................................ 362/647
2005/0045902 A1 * 3/2005 Ng et al. ....................... 257/100

(Continued)

FOREIGN PATENT DOCUMENTS

JP 62-149180 7/1987
JP 6-163132 6/1994

(Continued)

OTHER PUBLICATIONS

International Search Report issued Mar. 22, 2011 in International (PCT) Application No. PCT/JP2010/072840.

(Continued)

*Primary Examiner* — Stephen W Smoot

(74) *Attorney, Agent, or Firm* — Wenderoth, Lind & Ponack, L.L.P.

(57) ABSTRACT

The invention of the present application provides a lighting apparatus that has superior waterproofing property, durability, impact resistance, and pressure resistance and that can be used in various places such as a construction site, a plastic greenhouse, a poultry house, water, or seawater.

The invention of the present application provides a lighting apparatus in which electric wires are connected to a substrate 3 on which light-emitting diodes 31, 32, and 33 are mounted and synthetic resin material is used to closely cover the electric wires 52 and 53, the substrate 3, and the light-emitting diodes 31, 32, and 33 in an integrated manner.

10 Claims, 10 Drawing Sheets

(56) References Cited

U.S. PATENT DOCUMENTS

| | | | | |
|---|---|---|---|---|
| 2006/0046327 | A1* | 3/2006 | Shieh et al. | 438/21 |
| 2008/0121900 | A1* | 5/2008 | Wu et al. | 257/88 |
| 2009/0273921 | A1* | 11/2009 | Chiang | 362/101 |
| 2010/0320902 | A1* | 12/2010 | Yu | 315/32 |
| 2011/0284914 | A1* | 11/2011 | Suzuki et al. | 257/99 |
| 2012/0025215 | A1* | 2/2012 | Chen et al. | 257/88 |

FOREIGN PATENT DOCUMENTS

| | | |
|---|---|---|
| JP | 2002-245819 | 8/2002 |
| JP | 2002-280617 | 9/2002 |
| JP | 2003-303504 | 10/2003 |
| JP | 2005-093097 | 4/2005 |
| JP | 2005-294334 | 10/2005 |
| JP | 3142719 | 6/2008 |
| JP | 2008-277116 | 11/2008 |
| JP | 2008-305837 | 12/2008 |
| JP | 2009-181808 | 8/2009 |
| JP | 3152951 | 8/2009 |
| JP | 2009-198597 | 9/2009 |
| KR | 10-2009-0032351 | 4/2009 |

OTHER PUBLICATIONS

Japanese Office Action issued Nov. 16, 2010 in corresponding Japanese Patent Application No. 2009-286747 w/English translation.

* cited by examiner

LIGHTING APPARATUS ENCAPSULATED WITH SYNTHETIC RESIN MATERIAL HAVING TRANSLUCENT ILLUMINATION SECTION AND ALSO HAVING HEAT SINK SECTION MIXED WITH THERMAL CONDUCTIVE MATERIAL

TECHNICAL FIELD

The present invention relates to a lighting apparatus and the manufacture method thereof. In particular, the present invention relates to a lighting apparatus that uses a light-emitting diode light source and that is superior in the waterproofing property and the durability for example.

BACKGROUND ART

Conventionally, a lighting apparatus used in a construction site, a plastic greenhouse, or a poultry house for example has been configured so that a light bulb is screwed with a socket that is electrically connected to a power source via a cable. The construction waterproof socket disclosed in Patent Publication 1 has sufficient waterproofing property and durability for a socket. However, there has been a demand for the complete waterproofing property of the entire lighting apparatus and further-improved durability and impact resistance.

In recent years, the use of a light-emitting diode element as a light source for a lighting apparatus has been known because of the durability and energy conservation. It also has been known that this light-emitting diode is fixed by resin to form a light source unit. For example, all of Patent Publication 2 to Patent Publication 5 disclose a lighting system using a light-emitting diode. The disclosed lighting systems are a lighting system using a light-emitting diode module that is structured so that a rectangular parallelepiped-like housing includes therein a light-emitting diode module and the housing is filled with resin material. Thus, the disclosed lighting systems were not such a lighting apparatus that functioned as a light bulb. The resin filled in the housing is merely used to fix the light-emitting diode module, thus failing to provide a configuration for obtaining the complete waterproofing property, high durability, and impact resistance. Furthermore, Patent Publication 6 discloses a lighting system for an underwater lighting body that is assumed to be used in water. This lighting system is structured so that a light-emitting diode is sealed in an air room. Thus, although this lighting system provides a certain level of waterproofing property, this lighting system does not provide a pressure resistance that can withstand the water pressure of deep sea.

PRIOR ART PUBLICATION

Patent Publication

Patent Publication 1: Japanese Unexamined Patent Application Publication No. H6-163132
Patent Publication 2: Japanese Unexamined Patent Application Publication No. 2009-198597
Patent Publication 3: Japanese Unexamined Patent Application Publication No. 2009-181808
Patent Publication 4: Japanese Unexamined Patent Application Publication No. 2008-277116
Patent Publication 5: Japanese Unexamined Patent Application Publication No. 2003-303504
Patent Publication 6: Japanese Unexamined Patent Application Publication No. 2008-305837

SUMMARY OF THE INVENTION

Problem to be Solved by the Invention

However, a lighting apparatus mainly used for an outdoor application such as a construction site, a plastic greenhouse, or a poultry house for example must have superior waterproofing property, durability, and impact resistance. Specifically, the lighting apparatus is desired to have such an impact resistance that causes no damage even when being used in a harsh environment such as a construction site where the lighting apparatus is handled roughly and that can endure, in some cases, an impact by dynamite blasting for example. Such a lighting apparatus is desired that prevents water intrusion even when being subjected to the rainwater or water sprinkling in a construction site or antiseptic solution or cleaning solution in a plastic greenhouse or a poultry house and that is free from the risk of electrical leakage and has a complete waterproofing property. Such a lighting apparatus is also desired that has a complete waterproofing property for allowing lighting apparatus to be used in a pool or seawater and that has a high pressure resistance for allowing the lighting apparatus to withstand the water pressure of deep sea during the use in seawater. Thus, it is an objective of the invention of the present application to provide a lighting apparatus having a light-emitting diode as a light source that has superior waterproofing property, durability, impact resistance, and pressure resistance. This lighting apparatus can be used in various places such as a construction site, a plastic greenhouse, a poultry house, water or seawater.

Means for Solving the Problem

In order to achieve the above objective, the lighting apparatus of the present invention is structured so that a substrate on which a light-emitting diode is mounted is connected to an electric wire and synthetic resin material is used to closely cover the electric wire, the substrate, and the light-emitting diode in an integrated manner.

The synthetic resin material of the light-emitting diode-mounted-side of the substrate on which the light-emitting diode is mounted is translucent resin material to form an illumination section.

The illumination section is formed to have a planar shape, a convex shape, a convex lens-like shape, a concave shape, a concave lens-like shape, or a spherical shape.

The synthetic resin material is thermosetting resin material.

The synthetic resin material is mixed with thermal conductive material.

The thermal conductive material is a spherical-shaped alumina or ceramic.

The synthetic resin material has, at an outside thereof, a thermal conductive member.

The thermal conductive member is composed of thermal conductive material and has a bowl-like shape, a housing-like shape, or a tubular shape.

The thermal conductive member includes a plurality of heat dissipation blades.

According to a method of manufacturing the lighting apparatus of the invention of the present application, a substrate on which a light-emitting diode is mounted is connected to an electric wire and is placed in a mold. Then, the mold is filled with synthetic resin material and molded to closely cover the electric wire, the substrate, and the light-emitting diode by synthetic resin material in an integrated manner. The synthetic resin material of the light-emitting diode-mounted-side of the substrate functions as an illumination section.

A substrate on which a light-emitting diode is mounted is connected to an electric wire and is placed in a mold. Then, the mold is filled with synthetic resin material and is subjected to an injection molding to closely cover the electric wire, the substrate, and the light-emitting diode by synthetic resin material in an integrated manner. The synthetic resin material of the light-emitting diode-mounted-side of the substrate functions as an illumination section.

A substrate on which a light-emitting diode is mounted is connected to an electric wire. The substrate on which the light-emitting diode is mounted has, at an outer side thereof, a thermal conductive member having a bowl-like shape and a housing-like shape. The thermal conductive member is filled with molten synthetic resin material. Then, the synthetic resin material is cured to closely cover the electric wire, the substrate, and the light-emitting diode by synthetic resin material in an integrated manner. The synthetic resin material of the light-emitting diode-mounted-side of the substrate functions as an illumination section.

A substrate on which a light-emitting diode is mounted is connected to an electric wire. Then, a part at which the electric wire is connected to the substrate as well as the light-emitting diode are immersed in a cap body filled with molten synthetic resin material and the synthetic resin material is cured to closely cover the electric wire, the substrate, and the light-emitting diode by the synthetic resin material in an integrated manner. The light-emitting diode-mounted-side of the substrate functions as an illumination section.

Effect of the Invention

A substrate on which a light-emitting diode is mounted is connected to an electric wire. Synthetic resin material is used to closely cover the electric wire, the substrate, and the light-emitting diode in an integrated manner. Thus, the lighting apparatus can have a complete waterproofing property. Furthermore, the light-emitting diode, the substrate on which the light-emitting diode is mounted, and the light-emitting diode are closely covered by synthetic resin material, thus providing sufficient durability and impact resistance. Furthermore, since there is no space among the respective components, such a pressure resistance can be obtained that prevents water intrusion or the damage or deformation by a water pressure even in a pool or seawater for example. Therefore, such a lighting apparatus can be provided that can be used in a construction site, aplastic greenhouse, a poultry house, a pool, or seawater without the risk of damage or electrical leakage.

The synthetic resin material of the light-emitting diode-mounted-side of the substrate on which the light-emitting diode is mounted is translucent resin material to form an illumination section. Thus, all of the electric wire, the substrate, the light-emitting diode, and the illumination section are formed in an integrated manner by synthetic resin material. The translucent resin material emits light like a conventional light bulb, providing a sufficient illumination effect.

The illumination section is formed to have a planar shape, a convex shape, a convex lens-like shape, a concave shape, a concave lens-like shape, or a spherical shape. Thus, the light emitted from the light-emitting diode is reflected by the inner wall of the translucent resin material part and this light is collected by the illumination section. Thus, a desired illuminance or illumination area can be obtained. In particular, such a lighting apparatus can be provided that can provide an illuminance or illumination area deepening on an application by appropriately adjusting the length or shape of the translucent resin material filled to the light-emitting diode-mounted-side of the substrate.

The synthetic resin material is thermosetting resin material. Since thermosetting resin is hard and is strong against heat and solvent, such a lighting apparatus can be provided that is easily subjected to a shape forming and that has superior waterproofing property, durability, impact resistance, pressure resistance, and heat resistance.

The translucent resin material is mixed with thermal conductive material. Thus, a part mixed with the thermal conductive material functions as a heatsink. Thus, even when the substrate on which the light-emitting diode is mounted is subjected to heat, sufficient heat dissipation can be provided. Thus, sufficient heat dissipation is obtained without an additional thermal conductive member.

The thermal conductive material is a spherical-shaped alumina or ceramic. Thus, the thermal conductive material has a high affinity with synthetic resin material and can provide sufficient heat dissipation.

The translucent resin material has, at an outside thereof, a thermal conductive member. Thus, the thermal conductive member can function as a heatsink, thus providing sufficient heat dissipation.

The thermal conductive member is composed of thermal conductive material and has a bowl-like shape, a housing-like shape, or a tubular shape having a heat dissipation section. Thus, the respective components can be closely covered in an integrated manner for shape forming only by filling transparent resin in the thermal conductive member to cure the resin. The illumination section having a desired shape also can be formed by selecting the thermal conductive member having an appropriate shape.

The thermal conductive member includes a plurality of heat dissipation blades. Thus, the heatsink can have an increased heat dissipation area, thus improving the heat dissipation effect.

A substrate on which a light-emitting diode is mounted is connected to an electric wire and is placed in a mold. Then, the mold is filled with synthetic resin material and molded to closely cover the electric wire, the substrate, and the light-emitting diode by synthetic resin material in an integrated manner. Thus, the electric wire, the substrate, and the light-emitting diode can be closely covered in an integrated manner. Thus, the lighting apparatus can have a complete waterproofing property. Furthermore, sufficient durability can be obtained because the synthetic resin material closely covers the light-emitting diode, the substrate on which the light-emitting diode is mounted, and the light-emitting diode. Furthermore, since there is no space among the respective components, such a pressure resistance can be obtained that prevents water intrusion or the damage or deformation by a water pressure even in a pool or seawater for example.

A substrate on which a light-emitting diode is mounted is connected to an electric wire and is placed in a mold. Then, the mold is filled with synthetic resin material and is subjected to an injection molding to closely cover the electric wire, the substrate, and the light-emitting diode by synthetic resin material in an integrated manner. Thus, a part at which the electric wire is connected to the substrate as well as the light-emitting diode can be closely covered in an integrated manner. Thus, the lighting apparatus can have a complete waterproofing property. The electric wire, the substrate, and the light-emitting diode can be closely covered in an integrated manner. Thus, the lighting apparatus can have a complete waterproofing property. Furthermore, sufficient durability can be obtained because the light-emitting diode, the substrate on which the light-emitting diode is mounted, and the light-emitting diode are closely covered by synthetic resin material. Furthermore, since there is no space among the respective components, such a pressure resistance can be obtained that prevents water intrusion or the damage or deformation by a water pressure even in a pool or seawater for example. Furthermore, the use of an injection molding can provide a simultaneous shape forming and a simple manufacture process, thus providing uniform durability.

A substrate on which a light-emitting diode is mounted is connected to an electric wire. The substrate on which the light-emitting diode is mounted has, at an outer side thereof, a thermal conductive member having a bowl-like shape and a housing-like shape. The thermal conductive member is filled with molten synthetic resin material. Then, the synthetic resin material is cured to closely cover the electric wire, the substrate, and the light-emitting diode by synthetic resin material in an integrated manner. This can consequently dissipate heat even when the heat is emitted from the substrate for example. Furthermore, a part at which the electric wire is connected to the substrate on which the light-emitting diode is mounted, the substrate on which the light-emitting diode is mounted, and the light-emitting diode can be closely covered in an integrated manner by merely allowing the thermal conductive member having a bowl-like shape and a housing-like shape to be filled with the molten translucent resin material to cure the translucent resin material.

A substrate on which a light-emitting diode is mounted is connected to an electric wire. Then, a part at which the electric wire is connected to the substrate as well as the light-emitting diode are immersed in a cap body filled with molten synthetic resin material and the synthetic resin material is cured to closely cover a part at which the electric wire is connected to the substrate and the light-emitting diode by the synthetic resin material in an integrated manner. Therefore, the electric wire, the substrate, and the light-emitting diode can be closely covered in an integrated manner by merely fitting the cap body filled with translucent resin material to fill the spaces among the respective components with translucent resin material to cure the material. At the same time, the translucent resin material can be formed into an illumination section to have a desired shape. At the same time, the use of the cap body can eliminate the need for a special metal mold, thus manufacturing the lighting apparatus in a simple and low-cost manner.

DESCRIPTION OF REFERENCE NUMERALS

Figure 1:
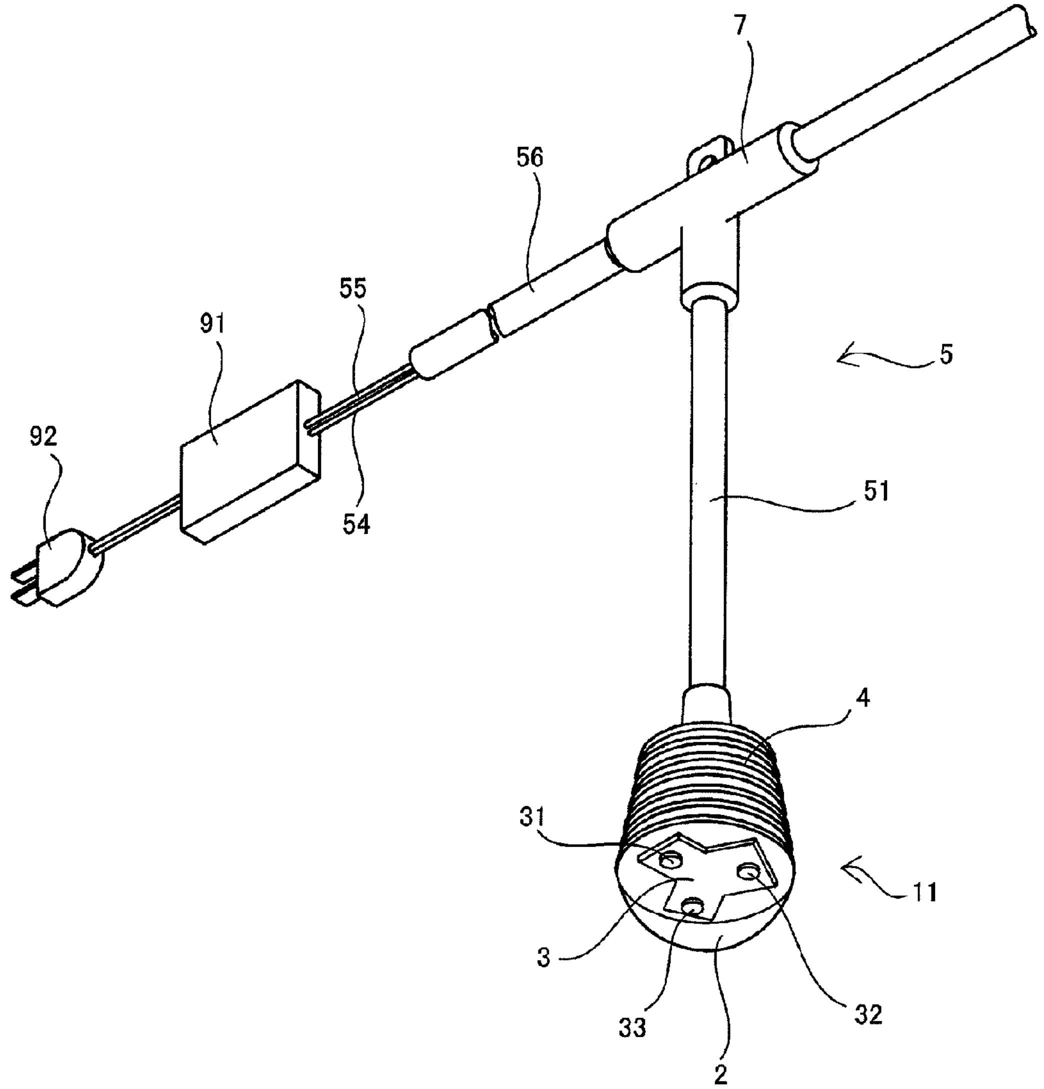
FIG. 1 is a perspective view illustrating the lighting apparatus of the first embodiment of the invention of the present application.

11 Lighting apparatus body
12 Lighting apparatus body
13 Lighting apparatus body
14 Lighting apparatus body
15 Lighting apparatus body
16 Lighting apparatus body
2 Translucent resin material
21 Illumination section
22 Connecting part
23 Connecting part
24 Translucent resin material
25 Translucent resin material
26 Alumina bead
27 Illumination section
28 Illumination section
29 Illumination section
3 Substrate
31 Light-emitting diode
32 Light-emitting diode
33 Light-emitting diode
34 Hole section
35 LED circuit
36 LED circuit
37 LED circuit
4 Heatsink
41 Heat dissipation blade
42 Heatsink section
43 Heat dissipation blade
5 Cable
51 Cable
52 Electric wire
53 Electric wire
54 Electric wire
55 Electric wire
56 Cable
57 Cable
58 Cable
6 Connecting part
7 Cable branching section
8 Heatsink
9 Cap body
91 Rectifier
92 Plug

MODE FOR CARRYING OUT THE INVENTION

Figure 2:
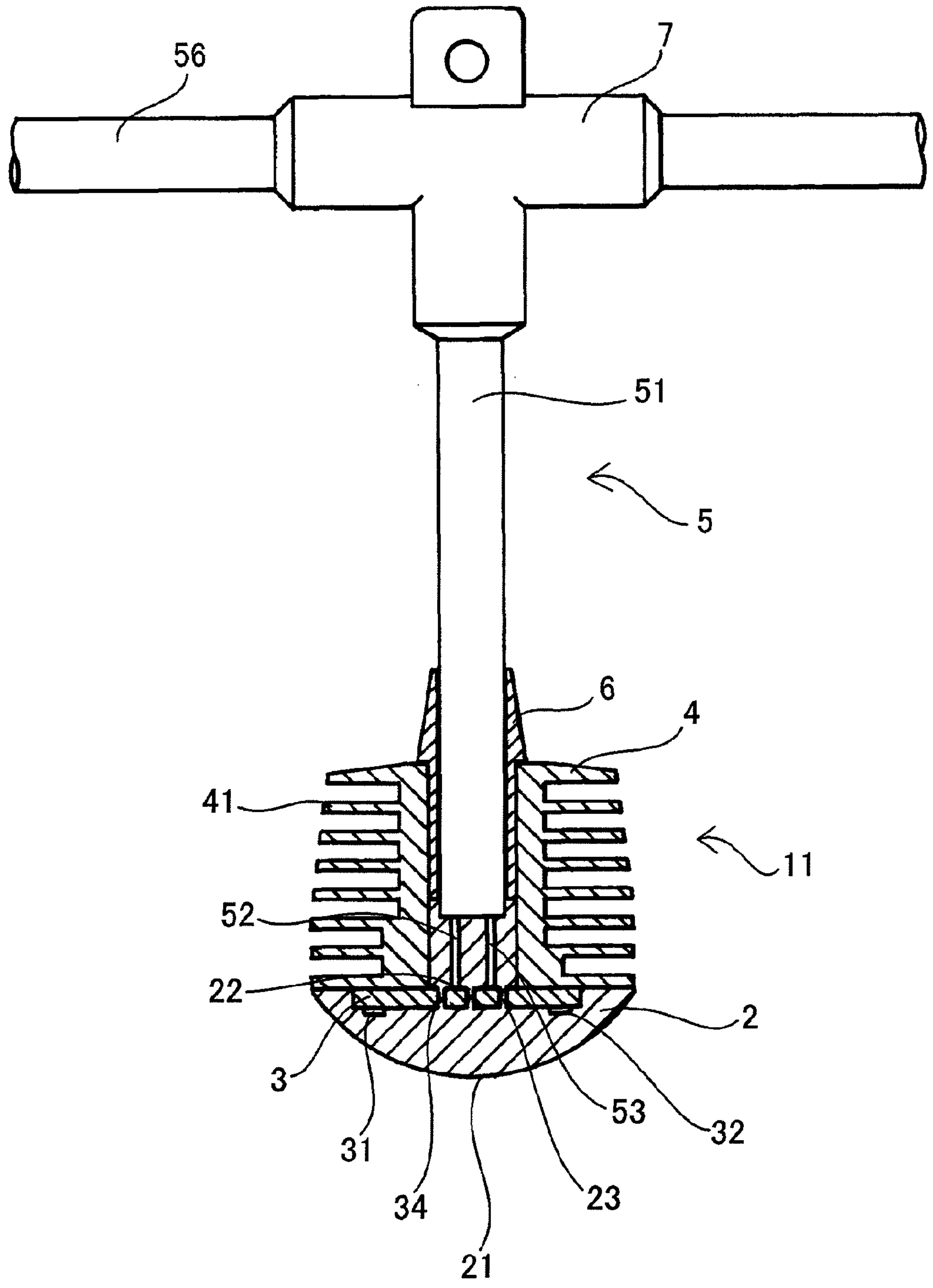
FIG. 2 is a partial cross-sectional view illustrating the lighting apparatus shown in FIG. 1.
Figure 3:
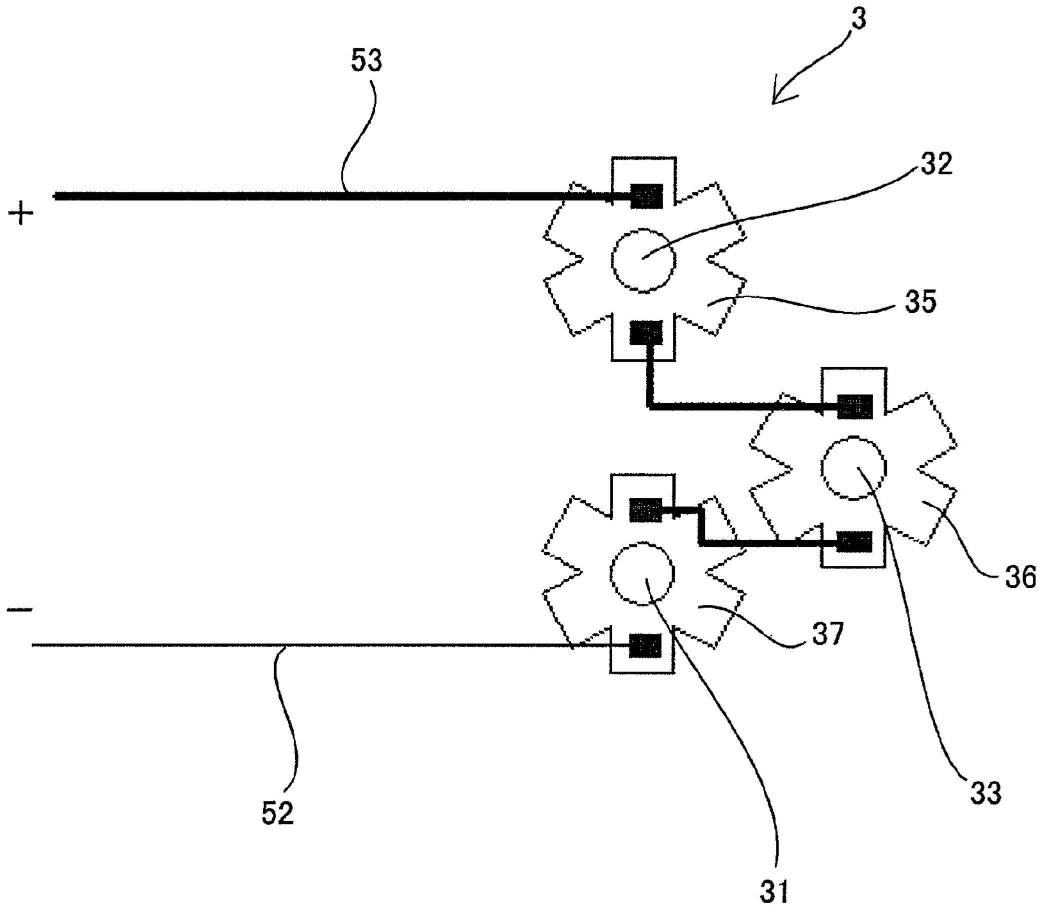
FIG. 3 illustrates the configuration of the LED circuit of the lighting apparatus shown in FIG. 1.

FIG. 1 to FIG. 3 illustrate the lighting apparatus of the first embodiment of the invention of the present application. The lighting apparatus of the first embodiment has: a lighting apparatus body 11; and a cable 5. The lighting apparatus body 1 is electrically connected to a power source (not shown) via electric wires 52 and 53 provided at the inner side of the cable 5, a rectifier 91, a plug 92, and a switch (not shown) for example. In this embodiment, the cable 5 is structured so that the lighting apparatus body 11 is provided at a tip end of a cable 51 branched from a main cable 56 connected to the power source. However, another configuration also may be used where the lighting apparatus body 11 is directly connected to the main cable 56 for covering electric wires 54 and 55 or the cable 51 can be branched in a freely-selected manner.

The lighting apparatus body 11 shown in FIG. 1 to FIG. 3 is composed of a substrate 3 on which light-emitting diodes 31, 32, and 33 as a light-emitting element are mounted, a heatsink 4, and an illumination section 21. The substrate 3 is connected to the electric wires 52 and 53. Translucent resin material of synthetic resin material is used to closely cover connecting parts 22 and 23 of the substrate 3 on which the light-emitting diodes 31, 32, and 33 are mounted with the electric wires 52 and 53 as well as the light-emitting diodes 31, 32, and 33 in an integrated manner. A side of the translucent resin material 2 at which the light-emitting diodes 31, 32, and 33 are mounted is formed to have a convex lens-like shape and functions as the illumination section 21, thereby providing the lighting apparatus.

As shown in FIG. 3, the substrate 3 has thereon the light-emitting diodes 31, 32, and 33 as well as LED circuits 35, 36, and 37 and power is supplied to three light-emitting diodes. The substrate 3 is connected to the electric wires 52 and 53 so that the light-emitting diodes 31, 32, and 33 emit light via the LED circuits 35, 36, and 37. The substrate 3 is desirably a mesh substrate in which a hole section 34 is provided through which the molten translucent resin material 2 can flow. The number of the light-emitting diodes also may be 1, 2, or 4 or more. The configuration of the LED circuit is not limited to the above-described one.

The heatsink 4 is composed of a thermal conductive member such as metal and is shaped to have a tubular shape having a plurality of heat dissipation blades 41 in order to improve the heat dissipation. The heatsink 4 is provided to be abutted to the substrate 3 at an outer side of the translucent resin material 2 of an opposite side of the side at which the light-emitting diodes 31, 32, and 33 are mounted. When heat is emitted from the substrate 3, the heatsink 4 functions to dissipate the heat to prevent the lighting apparatus body 11 from having an increased temperature. The heatsink also may have a tubular shape not including the heat dissipation blades 41 or may have, instead of the heat dissipation blades 41, a structure suitable for heat dissipation such as a honeycomb structure. Alternatively, the heatsink 4 is not always required if a sufficient heat dissipation effect is provided only by the translucent resin material 2.

The electric wires 52 and 53 are electrically connected to the substrate 3. A part from the connecting parts 22 and 23 to the power source is covered by the insulating cable 51. A connecting part 6 of the cable 51 and the heatsink 4 and a connecting part such as a cable branching section 7 are covered by an insulating member made of thermoplastic resin so as to have flexibility. Such a thermoplastic resin material is desired that have superior heat resistance, chemical resistance, electric property, dimension stability, shape forming property, and flame resistance such as polybutylene terephthalate.

The translucent resin material 2 is made of insulating thermosetting resin material and is translucent resin material that is transparent or semi-transparent or that is mixed with a pigment of a desired color so that the light emitted from the light-emitting diodes 31, 32, and 33 can pass through the translucent resin material 2. This translucent resin material 2 closely covers the connecting parts 22 and 23 of the electric wires 52 and 53 and the substrate 3 as well as the light-emitting diodes 31, 32, and 33 in an integrated manner so as to closely cover the periphery of these components without causing a space thereamong. The translucent resin material 2 at a side at which the light-emitting diodes 31, 32, and 33 are mounted is formed to have a convex lens-like shape to thereby form the illumination section 21. Light emitted from the light-emitting diodes 31, 32, and 33 is reflected in the translucent resin material 2 to collect light to brightly illuminate the illumination section 21. Synthetic resin material provided at an opposite side of the side at which the light-emitting diodes 31, 32, and 33 are mounted is not always required to be translucent.

The translucent resin material 2 also functions as adhesive agent of the heatsink 4 so that the heatsink 4 is closely provided at the outer side of the translucent resin material 2 of an opposite side of the side at which the light-emitting diodes 31, 32, and 33 are mounted. The translucent resin material 2 is desirably translucent thermosetting resin such as polyester resin, polyurethane resin, epoxy resin, or silicon. However, the translucent resin material also may be thermoplastic resin so long as the thermoplastic resin has a melting point higher than the temperature emitted from the substrate 3 for example.

According to one of the methods of manufacturing the lighting apparatus of the first embodiment, the substrate 3 on which the light-emitting diodes 31, 32, and 33 are mounted, as well as the connecting part of the substrate 3 and the electric wires 52 and 53 are placed in a mold. Then, the mold is filled with the molten translucent resin material 2 for molding. Then, the heatsink 4 is provided at the periphery thereof to cure the translucent resin material 2 to thereby closely cover the respective members in an integrated manner and to form the illumination section 21. At least the side at which the light-emitting diodes 31, 32, and 33 are mounted is filled with the translucent resin material 2. Thus, an opposite side of the side at which the light-emitting diodes 31, 32, and 33 are mounted may be filled with non-translucent resin material for molding.

According to another manufacture method, the substrate 3 on which the light-emitting diodes 31, 32, and 33 are mounted as well as the connecting part of the substrate 3 and the electric wires 52 and 53 are placed in a mold. Then, the heatsink 4 is provided at the periphery thereof to subject these members to an injection molding by the translucent resin material 2 to thereby closely cover the respective members in an integrated manner and to form an illumination section. At least the side at which the light-emitting diodes 31, 32, and 33 are mounted is filled with the translucent resin material 2. Thus, an opposite side of the side at which the light-emitting diodes 31, 32, and 33 are mounted may be filled with non-translucent resin material for an injection molding.

Figure 10:
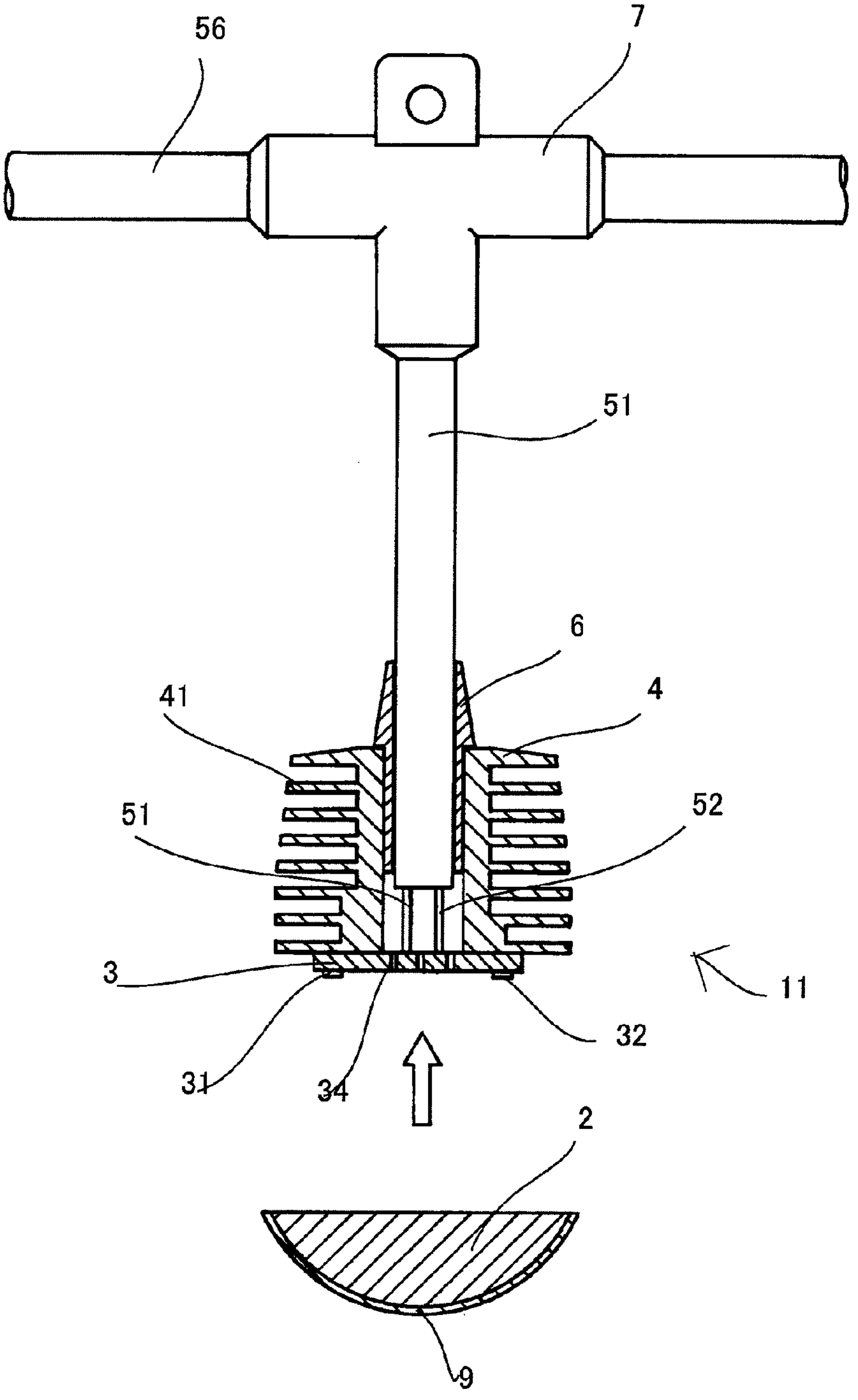
FIG. 10 is an exploded cross-sectional view illustrating the method of manufacturing the lighting apparatus of the first embodiment of the invention of the present application.

According to another manufacture method, as shown in FIG. 10, the substrate 3 on which the light-emitting diodes 31, 32, and 33 are mounted is connected to the electric wires 52 and 53. Then, while the light-emitting diodes 31, 32, and 33, the substrate 3, as well as the connecting parts 22 and 23 of the electric wires 52 and 53 being immersed in a cap body 9 having a convex lens-like shape filled with the molten translucent resin material 2, the cap body 9 is fixed and the translucent resin material 2 is cured. As a result, the respective members are closely formed in an integrated manner and the illumination section 21 is formed. The cap body 9 can be repeatedly used by being removed after curing the translucent resin material 2.

Figure 4:
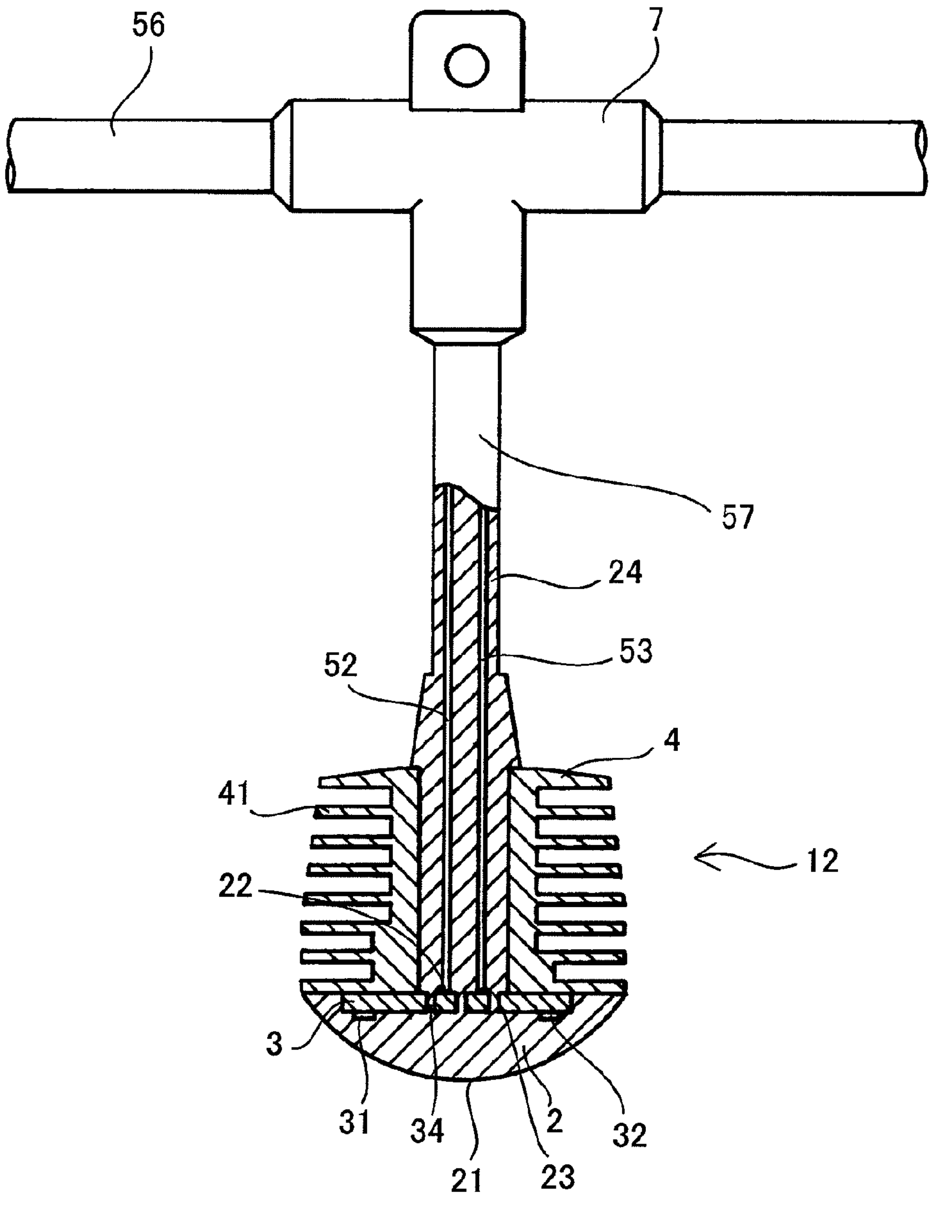
FIG. 4 is a partial cross-sectional view illustrating the lighting apparatus of the second embodiment of the invention of the present application.

FIG. 4 illustrates the lighting apparatus of the second embodiment of the invention of the present application. The lighting apparatus of the second embodiment is a lighting apparatus in which the translucent resin material 2 is used to closely cover, in an integrated manner, all of the connecting parts 22 and 23 of the electric wires 52 and 53 and the substrate 3, the electric wires 52 and 53, the substrate 3 on which the light-emitting diodes 31, 32, and 33 are mounted, the light-emitting diodes 31, 32, and 33, and the illumination section 21. Specifically, a translucent resin material 24 surrounding the electric wires 52 and 53 forms a cable 57. The synthetic resin material covering the electric wires 52 and 53 is not always required to be the translucent one.

This lighting apparatus is composed of a lighting apparatus body 12 and the cable 57. The lighting apparatus body 12 is electrically connected to a power source (not shown) via the electric wires 52 and 53 provided at the inner side of the cable 57, the rectifier 91, the plug 92, and a switch (not shown) for example. In this embodiment, the lighting apparatus body 12 is provided at a tip end of the cable 57 branched from the main cable 56 connected to the power source. However, another configuration also may be used where the lighting apparatus body 12 is directly connected to the main cable 56 or the cable 57 can be branched in a freely-selected manner.

As shown in FIG. 4, the lighting apparatus body 12 is composed of: the substrate 3 on which the light-emitting diodes 31, 32, and 33 as a light-emitting element are mounted; the heatsink 4; and the illumination section 21. The substrate 3 is connected to the electric wires 52 and 53. The translucent resin material 2 is used to closely cover the electric wires 52 and 53, the substrate 3 on which the light-emitting diodes 31, 32, and 33 are mounted, and the light-emitting diodes 31, 32, and 33 in an integrated manner. The lighting apparatus body 12 is a lighting apparatus in which the translucent resin material 2 of the side at which the light-emitting diodes 31, 32, and 33 are mounted functions as the illumination section 21. A range from the illumination section 21 to the cable 57 of the translucent resin material 24 covering the electric wires 52 and 53 is entirely formed by the translucent resin material 2 in an integrated manner. A range from the illumination section 21 to the main cable 56 also may be formed in an integrated manner.

The configuration and shape of the substrate 3 and the heatsink 4 are the same as those of the first embodiment and thus will not be described further.

The translucent resin material 2 is made of insulating thermosetting resin material and is translucent resin material that is transparent or semi-transparent or that is mixed with a pigment of a desired color. The translucent resin material 2 is formed of material through which light emitted from the light-emitting diodes 31, 32, and 33 pass. This translucent resin material 2 closely covers the electric wires 52 and 53, the substrate 3, and the light-emitting diodes 31, 32, and 33 in an integrated manner to closely cover the periphery of these components without causing a space thereamong. The translucent resin material 2 of the side at which the light-emitting diodes 31, 32, and 33 are mounted is formed to have a convex lens-like shape to thereby form the illumination section 21. Light emitted from the light-emitting diodes 31, 32, and 33 is reflected in the translucent resin material 2 to collect light to brightly illuminate the illumination section 21. In this manner, the translucent resin material 2 is used to form the electric wires 52 and 53, the substrate 3, the light-emitting diodes 31, 32, and 33, and the illumination section 21 in an integrated manner. The synthetic resin material of an opposite side of the side at which the light-emitting diodes 31, 32, and 33 are mounted is not always required to be the translucent one.

The translucent resin material 2 also functions as adhesive agent of the heatsink 4 so that the heatsink 4 is closely provided at the outer side of the translucent resin material 2 of an opposite side of the side at which the light-emitting diodes 31, 32, and 33 are mounted. The translucent resin material 2 is desirably translucent material such as polyester resin, polyurethane resin, epoxy resin, or silicon. However, the translucent resin material also may be thermoplastic resin so long as the thermoplastic resin has a melting point higher than the temperature emitted from the substrate 3 for example.

According to one of the methods of manufacturing the lighting apparatus of the second embodiment, the substrate 3 on which the light-emitting diodes 31, 32, and 33 are mounted as well as the electric wires 52 and 53 connected to the substrate 3 are placed in a mold. Then, the mold is filled with the molten translucent resin material 2 and is molded. Then, the heatsink 4 is provided at the periphery thereof to cure the translucent resin material 2 to thereby closely cover the respective members in an integrated manner and to form the illumination section 21. At least the side at which the light-emitting diodes 31, 32, and 33 are mounted is filled with the translucent resin material 2. Thus, an opposite side of the side at which the light-emitting diodes 31, 32, and 33 are mounted may be filled with non-translucent resin material for molding.

According to another manufacture method, the substrate 3 on which the light-emitting diodes 31, 32, and 33 are mounted as well as the electric wires 52 and 53 connected to the substrate 3 are placed in a mold. Then, these members are subjected to an injection molding by the translucent resin material 2 to thereby closely cover the respective members in an integrated manner and to form the illumination section 21. At least the side at which the light-emitting diodes 31, 32, and 33 are mounted is filled with the translucent resin material 2. Thus, an opposite side of the side at which the light-emitting diodes 31, 32, and 33 are mounted may be filled with non-translucent resin material for molding.

Figure 5:
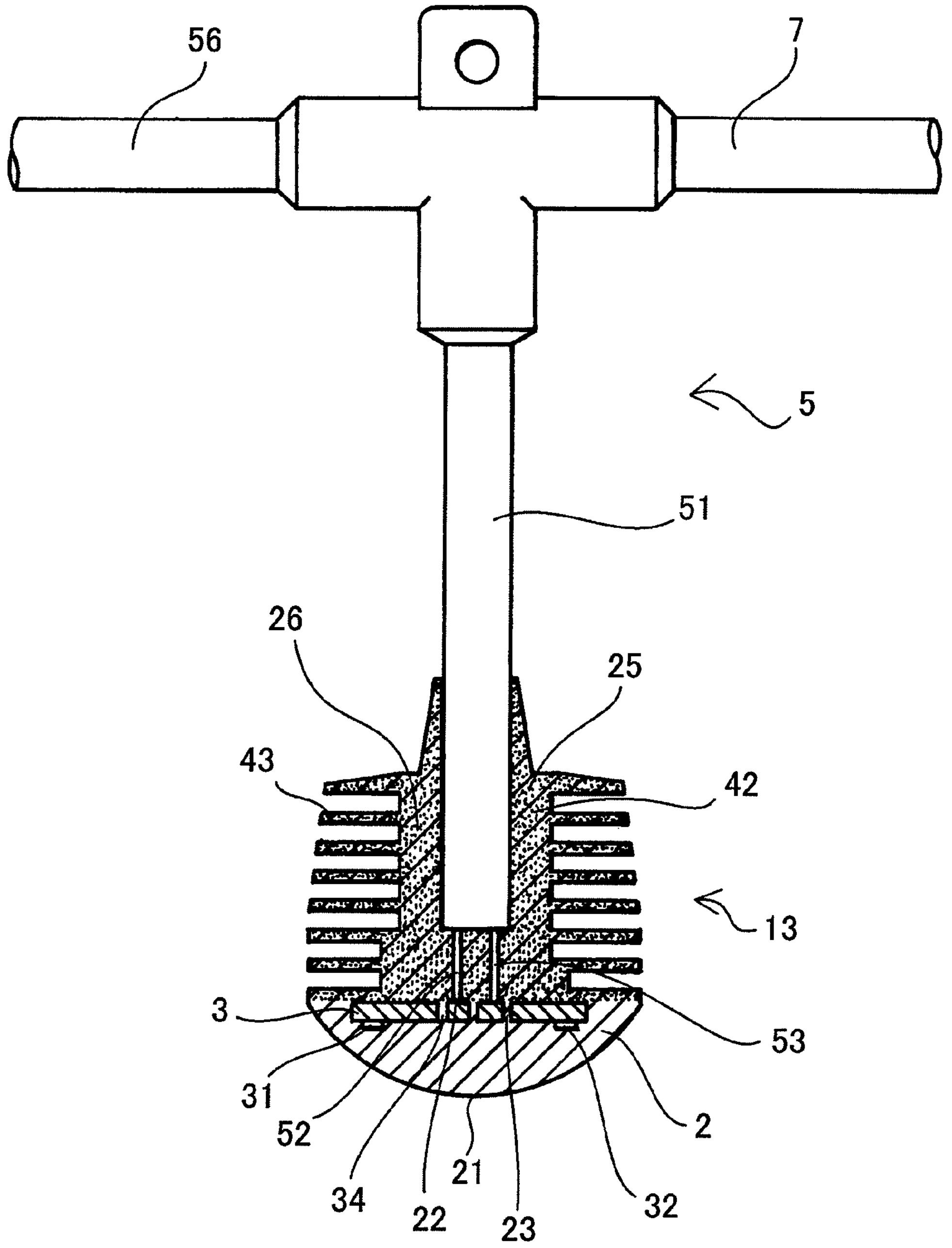
FIG. 5 is a partial cross-sectional view illustrating the lighting apparatus of the third embodiment of the invention of the present application.

FIG. 5 illustrates the lighting apparatus of the third embodiment of the invention of the present application. The lighting apparatus of the third embodiment is a lighting apparatus in which the electric wires 52 and 53, the substrate 3 on which the light-emitting diodes 31, 32, and 33 are mounted, the light-emitting diodes 31, 32, and 33, the illumination section 21, as well as heatsink section 42 are all closely covered by the translucent resin material 2 in an integrated manner.

This lighting apparatus is composed of a lighting apparatus body 13 and the cable 5. The lighting apparatus body 13 is electrically connected to a power source (not shown) via the electric wires 52 and 53 provided at the inner side of the cable 5, the rectifier 91, and the plug 92 for example. In this embodiment, the lighting apparatus body 13 is provided at a tip end of the cable 51 branched from the main cable 56 connected to the power source. However, another configuration also may be used where the lighting apparatus body 13 is directly connected to the main cable 56 or the cable 51 can be branched in a freely-selected manner.

As shown in FIG. 5, the lighting apparatus body 13 is composed of: the substrate 3 on which the light-emitting diodes 31, 32, and 33 as a light-emitting element are mounted; and the heatsink 4. The substrate 3 is connected to the electric wires 52 and 53. The translucent resin material 2 is used to closely cover the electric wires 52 and 53, the substrate 3 on which the light-emitting diodes 31, 32, and 33 are mounted, and the light-emitting diodes 31, 32, and 33 in an integrated manner. The translucent resin material 2 of the side at which the light-emitting diodes 31, 32, and 33 are mounted functions as the illumination section 21. The translucent resin material 2 at an opposite side of the side at which the light-emitting diodes 31, 32, and 33 are mounted functions as the heatsink section 42.

The configuration and shape of the substrate 3 are the same as those of the first embodiment and thus will not be described further. The electric wires 52 and 53 in a naked status are electrically connected to the substrate 3. The electric wires 52 and 53 are covered by the translucent resin material 2. This translucent resin material 2 also functions as the heatsink section 42.

The translucent resin material 2 is composed of insulating thermosetting resin material and is a translucent member that is transparent or semi-transparent or that is mixed with a pigment of a desired color. The translucent resin material 2 is formed of light transmissive material. This translucent resin material 2 closely covers the electric wires 52 and 53, the substrate 3, and the light-emitting diodes 31, 32, and 33 in an integrated manner to closely cover the periphery of these components without causing a space thereamong.

The translucent resin material 2 at a side at which the light-emitting diodes 31, 32, and 33 are mounted is formed to have a convex lens-like shape to thereby form the illumination section 21 through which light emitted from the light-emitting diodes 31, 32, and 33 is reflected in the translucent resin material 2 to collect light to brightly illuminate the illumination section 21. The translucent resin material 2 at an opposite side of the side at which the light-emitting diodes 31, 32, and 33 are mounted is mixed with alumina beads 26 as thermal conductive material formed to have a minute spherical shape to thereby function as the heatsink section 42. In this manner, the electric wires 52 and 53, the substrate 3, the light-emitting diodes 31, 32, and 33, the illumination section 21, and the heatsink section 42 are formed by the translucent resin material 2 in an integrated manner.

As described above, the heatsink section 42 is obtained by mixing the translucent resin material 2 with the alumina beads 26. In order to improve the heat dissipation, the heatsink section 42 is formed to have a plurality of heat dissipation blades 43. When heat is emitted from the substrate 3, the heatsink section 42 dissipates the heat to prevent the lighting apparatus body 13 from having an increased temperature. The heatsink also may have a shape not including the heat dissipation blades 43 or may have, instead of the heat dissipation blades 43, a structure suitable for heat dissipation such as a honeycomb structure. The thermal conductive material is not limited to alumina and also may be thermal conductive materials such as ceramic or metal. The shape of thermal conductive material is not limited to the spherical shape and also may be a powdered or granular shape.

The translucent resin material 2 is desirably translucent material such as polyester resin, polyurethane resin, epoxy resin, or silicon. However, the translucent resin material also may be thermoplastic resin so long as the thermoplastic resin has a melting point higher than the temperature emitted from the substrate 3 for example.

According to one of the methods of manufacturing the lighting apparatus of the third embodiment, the substrate 3 on which the light-emitting diodes 31, 32, and 33 are mounted, as well as the connecting part of the substrate 3 and the electric wires 52 and 53 are placed in a mold. Then, parts for forming the heatsink section 42 are mixed with alumina powders. These parts are molded by the translucent resin material 2 to thereby closely form the respective members in an integrated manner and to form the illumination section 21 and the heatsink section 42.

According to another manufacture method, the substrate 3 on which the light-emitting diodes 31, 32, and 33 are mounted, as well as the connecting part of the substrate 3 and the electric wires 52 and 53 are placed in a mold. Then, parts for forming the heatsink section 42 are mixed with alumina powders. These parts are subjected to injection molding by the translucent resin material 2 to thereby closely form the respective members in an integrated manner and to form the illumination section 21 and the heatsink section 42.

Figure 6:
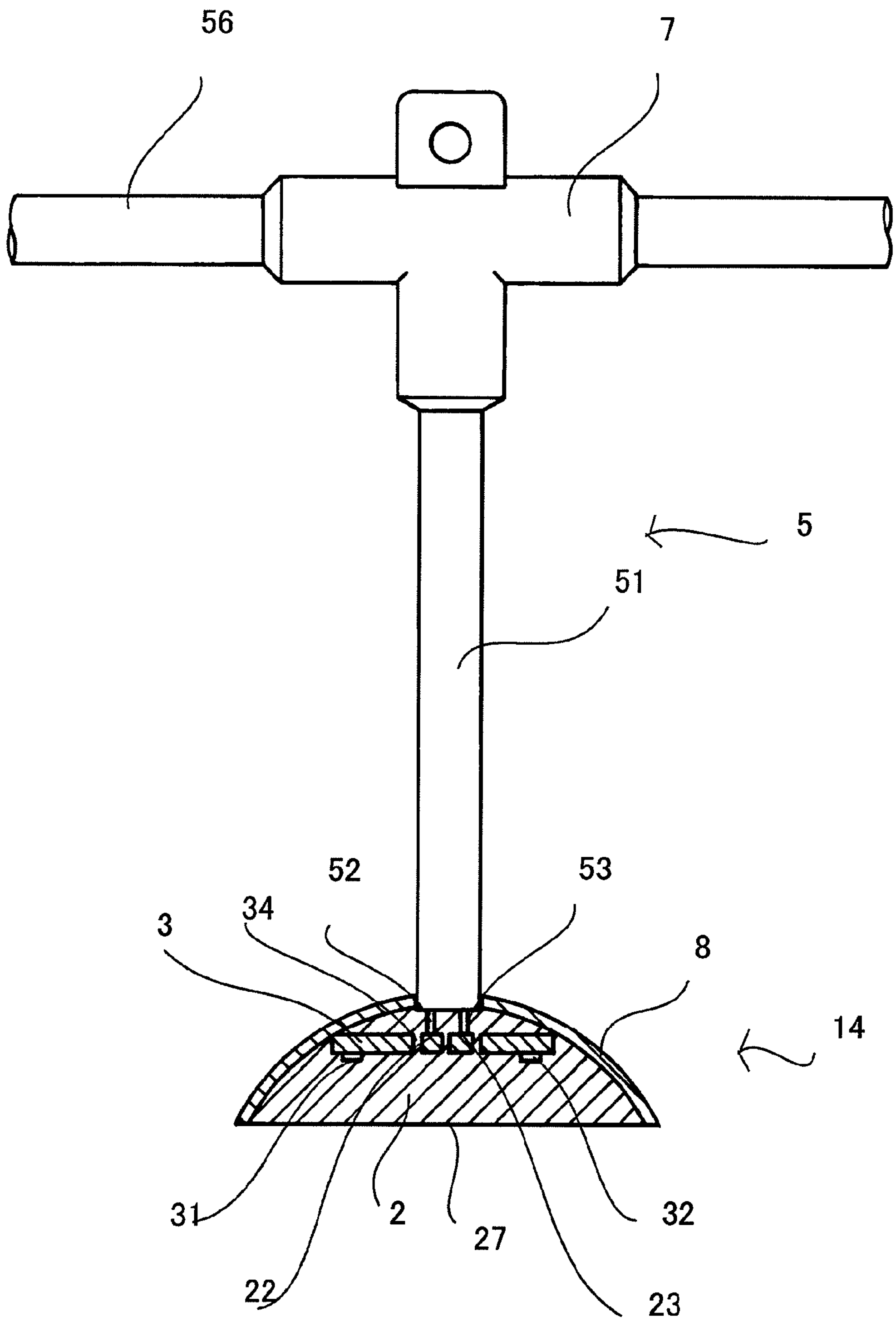
FIG. 6 is a partial cross-sectional view illustrating the lighting apparatus of the fourth embodiment of the invention of the present application.

FIG. 6 illustrates the fourth embodiment of the lighting apparatus of the invention of the present application. The lighting apparatus of the fourth embodiment is a lighting apparatus in which the electric wires 52 and 53, the substrate 3 on which the light-emitting diodes 31, 32, and 33 are mounted, and the light-emitting diodes 31, 32, and 33 are surrounded by a bowl-like heatsink 8. This heatsink 8 is filled with the translucent resin material 2 to closely form the respective components in an integrated manner.

This lighting apparatus is composed of a lighting apparatus body 14 and the cable 5. The lighting apparatus body 14 is electrically connected to a power source (not shown) via the electric wires 52 and 53 provided at the inner side of the cable 51, the rectifier 91, the plug 92, and a switch (not shown) for example. In this embodiment, the lighting apparatus body 14 is provided at a tip end of the cable 51 branched from the main cable 56 connected to the power source. However, another configuration also may be used where the lighting apparatus body 14 is directly connected to the main cable 56 or the cable 51 can be branched in a freely-selected manner.

As shown in FIG. 6, the lighting apparatus body 14 has: the substrate 3 on which the light-emitting diodes 31, 32, and 33 as a light-emitting element are mounted, and the bowl-like heatsink 8 provided at the outer side of the substrate 3. The substrate 3 is connected to the electric wires 52 and 53 to penetrate the heatsink 8. The heatsink 8 is filled with the translucent resin material 2 to thereby form an illumination section 27.

The heatsink 8 is composed of a thermal conductive member such as metal and is structured so that the electric wires 52 and 53 penetrate through the hole sections opened at the bottom section thereof. Thus, the heatsink 8 has both of a function of a heatsink and a function of a case filled with the molten translucent resin material 2. The shape of the heatsink 8 is not limited to this and also may be a housing-like shape or another shape.

The translucent resin material 2 is made of insulating thermosetting resin material and is translucent resin material that is transparent or semi-transparent or that is mixed with a pigment of a desired color so that the light emitted from the light-emitting diodes 31, 32, and 33 can pass through the translucent resin material 2. The heatsink 8 including the respective components is filled with this translucent resin material 2 to closely cover the respective components in an integrated manner and to form the illumination section 27 having a planar shape.

According to one of the methods of manufacturing the lighting apparatus of the fourth embodiment, the heatsink 8 includes therein the substrate 3 on which the light-emitting diodes 31, 32, and 33 are mounted as well as the connecting part of the substrate 3 and the electric wires 52 and 53. Then, the heatsink 8 is filled with the molten translucent resin material 2 and is molded.

Figure 7:
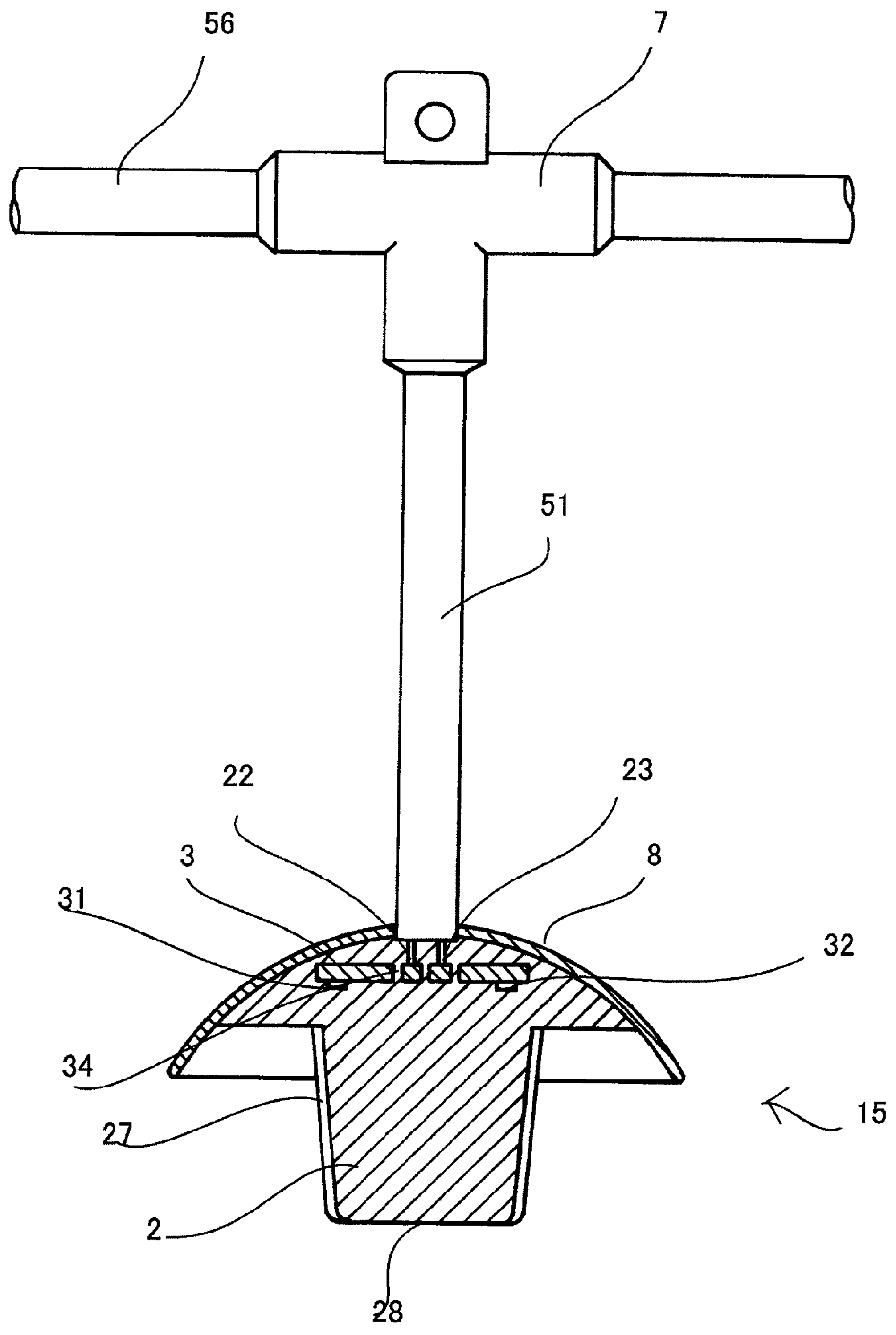
FIG. 7 is a partial cross-sectional view illustrating the lighting apparatus of the fifth embodiment of the invention of the present application.
Figure 8:
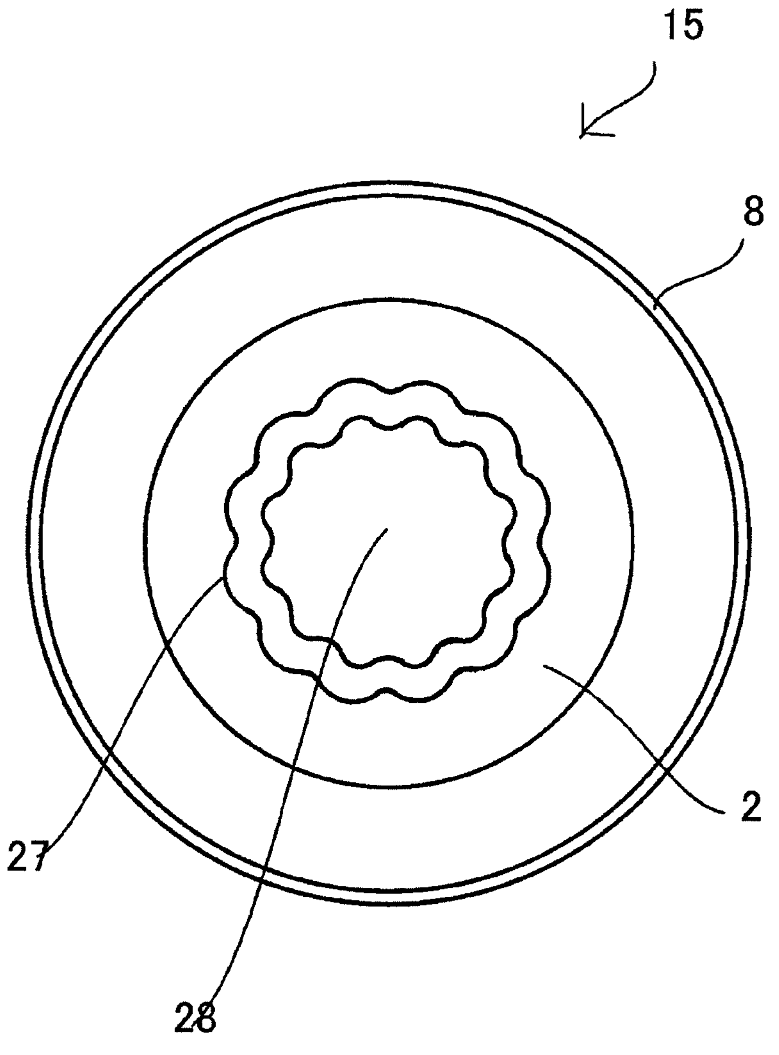
FIG. 8 is a top view illustrating the lighting apparatus shown in FIG. 7.

FIG. 7 and FIG. 8 illustrate the fifth embodiment of the lighting member of the invention of the present application. The lighting apparatus of the fifth embodiment is a lighting apparatus structured so that the electric wires 52 and 53, the substrate 3 on which the light-emitting diodes 31, 32, and 33 are mounted, as well as the light-emitting diodes 31, 32, and 33 are surrounded by the bowl-like heatsink 8. This heatsink 8 is filled with the translucent resin material 2 to form the respective components in an integrated manner to form an illumination section 28 having a convex shape.

This lighting apparatus is composed of a lighting apparatus body 15 and the cable 51. The lighting apparatus body 15 is electrically connected to a power source (not shown) via the electric wires 52 and 53 provided at the inner side of the cable 51, the rectifier 91, the plug 92, and a switch (not shown) for example. In this embodiment, the lighting apparatus body 15 is provided at a tip end of the cable 51 branched from the main cable 56 connected to the power source. However, another configuration also may be used where the lighting apparatus body 15 is directly connected to the main cable 56 or the cable 51 can be branched in a freely-selected manner.

As shown in FIG. 7, the lighting apparatus body 15 has: the substrate 3 on which the light-emitting diodes 31, 32, and 33 as a light-emitting element are mounted; and the heatsink 8 having a bowl-like shape that is provided at the outer side of the substrate 3. The substrate 3 is connected to the electric wires 52 and 53 to penetrate the heatsink 8. The heatsink 8 is filled with the translucent resin material 2 to form the translucent resin material 2 to have a convex shape to thereby form the illumination section 28.

The heatsink 8 is composed of a thermal conductive member such as metal formed to have a bowl-like shape. The heatsink 8 is structured so that the electric wires 52 and 53 penetrate through the hole sections opened at the bottom section thereof. Thus, the heatsink 8 has both of a function of a heatsink and a function of a case filled with the molten translucent resin material 2. The shape of the heatsink 8 is not limited to this and also may be a housing-like shape or another shape.

The translucent resin material 2 is made of insulating thermosetting resin material and is translucent resin material that is transparent or semi-transparent or that is mixed with a pigment of a desired color. The translucent resin material 2 is formed of light transmissive material. The heatsink 8 including the respective components is filled with this translucent resin material 2 to form the translucent resin material 2 to have a convex shape and to closely cover the respective components in an integrated manner and to form the illumination section 28 having a planar shape. This illumination section 28 having a convex shape is structured, as shown in FIG. 8, so that a side face has a concavo-convex shape. This side face diffuses the light emitted from the light-emitting diodes 31, 32, and 33 to thereby brightly illuminate the illumination section 28.

According to one of the methods of manufacturing the lighting apparatus of the fifth embodiment, the heatsink 8 includes therein the substrate 3 on which the light-emitting diodes 31, 32, and 33 are mounted as well as the connecting part of the substrate 3 and the electric wires 52 and 53. Then, the heatsink 8 is filled with the molten translucent resin material 2. A mold for forming a convex section applied to the heatsink is also filled with the translucent resin material 2 for molding.

Figure 9:
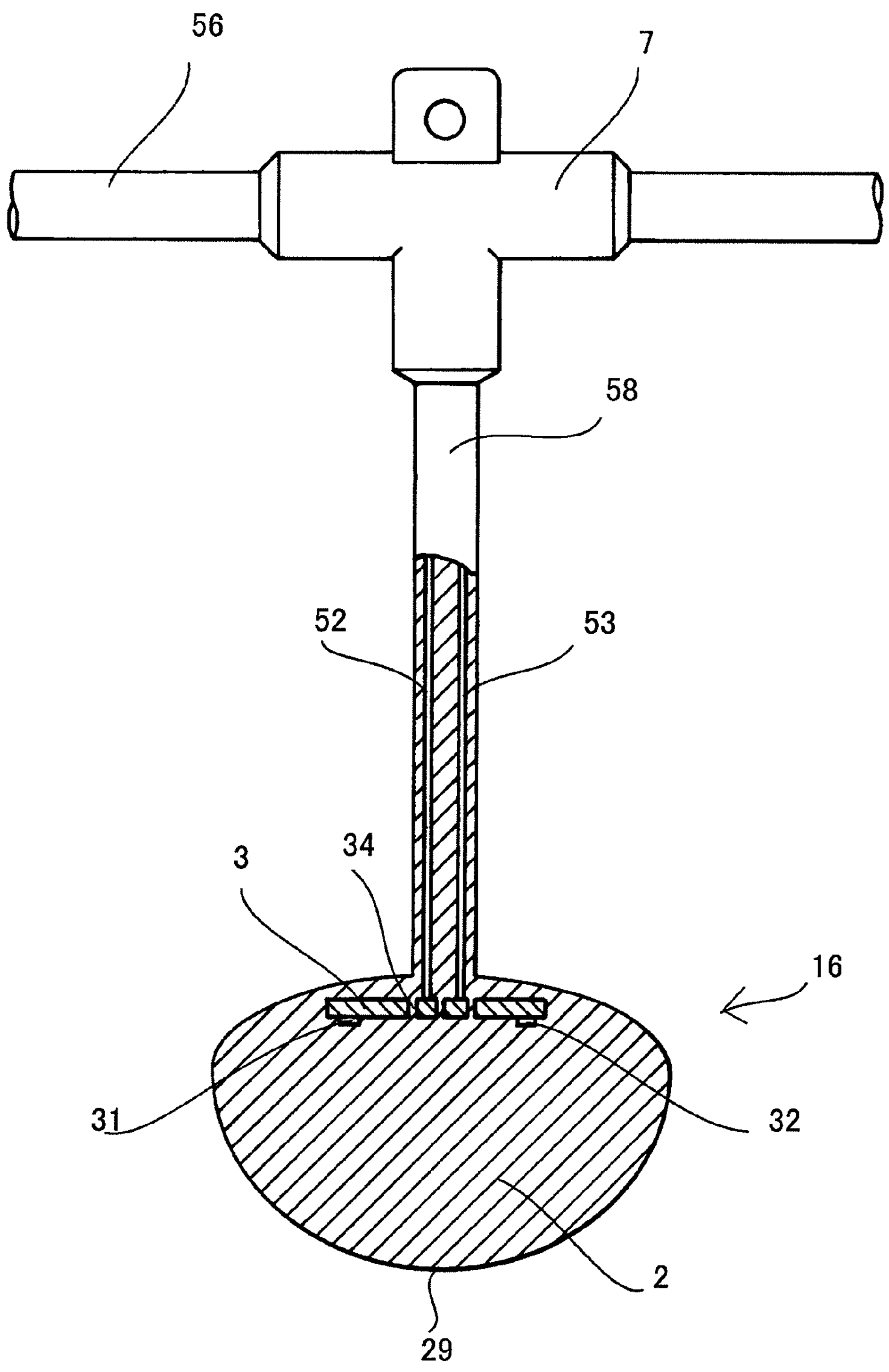
FIG. 9 is a partial cross-sectional view illustrating the lighting apparatus of the sixth embodiment of the invention of the present application.

FIG. 9 illustrates the lighting member of the sixth embodiment of the lighting apparatus of the invention of the present application. The lighting apparatus of the sixth embodiment is a lighting apparatus that includes the electric wires 52, 53, the substrate 3 on which the light-emitting diodes 31, 32, and 33 are mounted, as well as the light-emitting diodes 31, 32, and 33 entirely covered by the translucent resin material 2 in a close and integrated manner. The sixth embodiment is the simplest embodiment among the embodiments of the invention of the present application.

This lighting apparatus is composed of a lighting apparatus body 16 formed in an integrated manner and a cable 58. The lighting apparatus body 16 is electrically connected to a power source (not shown) via the electric wires 52 and 53 provided at the inner side of the cable 58, the rectifier 91, the plug 92, and a switch (not shown) for example. In this embodiment, the lighting apparatus body 16 is provided at a tip end of the cable branched from the main cable 56 connected to the power source. However, another configuration also may be used where the lighting apparatus body 16 is directly connected to the main cable 56 or the cable 58 can be branched in a freely-selected manner.

As shown in FIG. 9, the lighting apparatus body 16 is structured so that the substrate 3 on which the light-emitting diodes 31, 32, and 33 as a light-emitting element are mounted and the electric wires 52 and 53 connected to the substrate 3 are all closely formed in an integrated manner. The translucent resin material 2 at the side of the substrate 3 at which the light-emitting diodes 31, 32, and 33 are mounted is formed to have a spherical shape so that the front side of the illumination section forms the illumination section 29 having a convex lens-like shape.

The translucent resin material 2 is made of insulating thermosetting resin material and is translucent resin material that is transparent or semi-transparent or that is mixed with a pigment of a desired color. The translucent resin material is formed of material through which light from the light-emitting diodes 31, 32, and 33 pass. This translucent resin material 2 closely covers the respective members in an integrated manner and forms the illumination section 29 that has a spherical shape and that has a convex lens-like shape at the front side thereof. The light emitted from the light-emitting diodes 31, 32, and 33 is reflected in the illumination section 29 to collect light to brightly illuminate the illumination section 29.

According to one of the methods of manufacturing the lighting apparatus of the sixth embodiment, the substrate 3 on which the light-emitting diodes 31, 32, and 33 are mounted, the substrate 3, and the electric wires 52 and 53 are placed in a mold and the mold is filled with the molten translucent resin material 2 for molding.

According to another manufacture method, the substrate 3 on which the light-emitting diodes 31, 32, and 33 are mounted, the substrate 3, and the electric wires 52 and 53 are placed in a mold and these members are subjected to an injection molding by the translucent resin material 2 to thereby closely form the respective members in an integrated manner.

Although the embodiments of the present application have illustrated illumination sections of various shapes, the shape of the illumination section is not limited to these shapes. Thus, the illumination section may have a convex shape, a convex lens-like shape, or a spherical shape or also may have a desired shape depending on the application such as a concave shape or a concave lens-like shape.

Although the embodiments of the present application have illustrated a configuration in which the lighting apparatus body is provided at a tip end of the cable branched from the main cable, whether the cable is branched or not, the shape of the cable, and the number of connected cables are not limited to this.

INDUSTRIAL APPLICABILITY

The lighting apparatus can have a complete waterproofing property by having a configuration in which an electric wire is connected to a substrate on which a light-emitting diode is mounted and synthetic resin material is used to closely cover the electric wire, the substrate, and the light-emitting diode in an integrated manner. Furthermore, sufficient durability and impact resistance can be obtained by the synthetic resin material that closely covers the light-emitting diode, the substrate on which the light-emitting diode is mounted, and the light-emitting diode. Furthermore, no space among the respective members provides a pressure resistance by which the risk of water intrusion or breakage or deformation due to a water pressure can be prevented, even in a pool or seawater for example. Therefore, such a lighting apparatus can be provided that can be used in a construction site, a plastic greenhouse, a poultry house, a pool, or seawater without the risk of damage or electrical leakage.

What is claimed is:

1. A lighting apparatus comprising:

a substrate;

a light-emitting diode mounted to the substrate;

an electric wire connected to the light-emitting diode; and synthetic resin material closely covering a part at which the electric wire is connected to the substrate, the substrate, and the light-emitting diode in an integrated manner, wherein the synthetic resin material is integratedly fixed to the electric wire to be electrically connected to a power source and forms a cable, the synthetic resin material covering the substrate at a side on which the light-emitting diode is mounted is translucent resin material and an illumination section is formed to have a planar shape, a convex shape, a convex lens shape, a concave shape, a concave lens shape, or a spherical shape, and the synthetic resin material forming a heat sink section is mixed with a thermal conductive material.

2. The lighting apparatus according to claim 1, wherein the thermal conductive material is a spherical-shaped alumina or ceramic.

3. The lighting apparatus according to claim 2, wherein the synthetic resin material has, at an outside thereof, a thermal conductive member.

4. The lighting apparatus according to claim 3, wherein the thermal conductive member comprises thermal conductive material and has a bowl shape, a housing shape, or a tubular shape.

5. The lighting apparatus according to claim 4, wherein the thermal conductive member includes a plurality of heat dissipation blades.

6. The lighting apparatus according to claim 3, wherein the thermal conductive member includes a plurality of heat dissipation blades.

7. The lighting apparatus according to claim 1, wherein the synthetic resin material has, at an outside thereof, a thermal conductive member.

8. The lighting apparatus according to claim 7, wherein the thermal conductive member comprises of thermal conductive material and has a bowl shape, a housing shape, or a tubular shape.

9. The lighting apparatus according to claim 8, wherein the thermal conductive member includes a plurality of heat dissipation blades.

10. The lighting apparatus according to claim 7, wherein the thermal conductive member includes a plurality of heat dissipation blades.

* * * * *